United States Patent
Bulsara et al.

(10) Patent No.: US 10,877,074 B1
(45) Date of Patent: Dec. 29, 2020

(54) NON-LINEAR BIOMIMETIC MAGNETIC FIELD SENSOR AND ARRAY

(71) Applicant: THE UNITED STATES OF AMERICA AS REPRESENTED BY THE SECRETARY OF THE NAVY, San Diego, CA (US)

(72) Inventors: Adi R. Bulsara, San Diego, CA (US); Nigel Stocks, Coventry (GB); Alexander Nikitin, Coventry (GB)

( * ) Notice: Subject to any disclaimer, the term of this patent is extended or adjusted under 35 U.S.C. 154(b) by 601 days.

(21) Appl. No.: 15/707,512

(22) Filed: Sep. 18, 2017

(51) Int. Cl.
*G01C 19/00* (2013.01)
*G01R 15/20* (2006.01)
*H03B 5/32* (2006.01)
*G01R 33/07* (2006.01)

(52) U.S. Cl.
CPC ......... *G01R 15/202* (2013.01); *G01R 15/205* (2013.01); *G01R 15/207* (2013.01); *G01R 33/07* (2013.01); *H03B 5/326* (2013.01)

(58) Field of Classification Search
CPC .. G01R 15/202; G01R 15/205; G01R 15/207; G01R 33/07; H03B 5/326
USPC ........................................................ 702/104
See application file for complete search history.

(56) References Cited

U.S. PATENT DOCUMENTS

| 5,424,558 | A | * | 6/1995 | Borden | G01N 15/1425 250/573 |
| 9,739,851 | B2 | * | 8/2017 | Hoppensteadt | G01R 33/093 |

OTHER PUBLICATIONS

Zhi-Ling Tang et al., RF spectrum sensing based on an overdamped nonlinear oscillator ring for cognitive radios, Jun. 9, 2016, MDPI (Year: 2016).*
Sebastien Camalet et al., Auditory sensitivity provided by self-tuned critical oscillations of hair cells Mar. 28, 2000, PNAS, vol. 97 (Year: 2000).*
Nikitin, A. P. et al, "Enhancing the Resolution of a Sensor Via Negative Correlation: A Biologically Inspired Approach", Phys. Rev. Lett. 109, 238103, 2012.
Takeuchi, S. et al., "A resonant-type amorphous ribbon magnetometer driver by an operational amplifier", IEEE Trans. Magn. vol. mag-20, No. 5, pp. 1723-1725, 1984.
Camalet, S., et al,, "Auditory sensitivity provided by self-tuned critical oscillations of hair cells", Proc. Natl. Acad. Sci. USA, vol. 97, No. 7, pp. 3183-3188, 2000.
Fettiplace, R. et al., "The sensory and motor roles of auditory hair cells", Nat. Rev. Neurosci., vol. 7, pp. 19-29, 2006.

* cited by examiner

*Primary Examiner* — Aditya S Bhat
(74) *Attorney, Agent, or Firm* — Naval Information Warfare Center, Pacific; Kyle Eppele; James McGee

(57) ABSTRACT

A system and method include a non-linear dynamic sensor, such as a magnetic field sensor, having an oscillator with a dynamic response that passes through a critical point beyond which the oscillator responds in an oscillatory regime. A processor operatively connected to the non-linear dynamic sensor is configured to, based upon an input signal x received by the non-linear dynamic sensor, adaptively self-tune the non-linear dynamic sensor to a dynamic range within the oscillatory regime adjacent to the critical point such that the input signal x spans the entire dynamic range. An array of such sensors includes a global feedback capability to mitigate coupling losses.

20 Claims, 11 Drawing Sheets

NON-LINEAR BIOMIMETIC MAGNETIC FIELD SENSOR AND ARRAY

FEDERALLY SPONSORED RESEARCH AND DEVELOPMENT

This invention is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 104662.

BACKGROUND

Biological sensory systems are remarkable in their ability to detect extremely weak signals. A biomimetic approach would be beneficial for the design of advanced sensory systems due to the high sensitivity, large dynamic range, adaptability, and other remarkable features of biological sensory systems.

DETAILED DESCRIPTION OF SOME EMBODIMENTS

Figure 1:
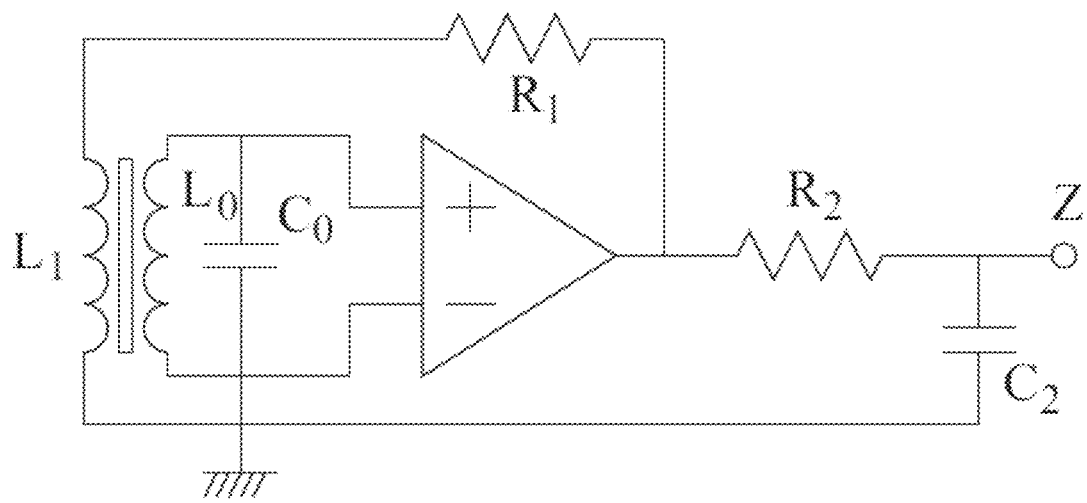
FIG. 1 shows a circuit schematic illustrating a prior art magnetic field sensor of Takeuchi and Harada.

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. They could (more likely for magnetic field sensors) also be inductively coupled; this coupling is a function of the separation. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

Disclosed herein are embodiments of systems/methods that may be used for an array of non-linear interacting sensors. The individual sensors can be tuned to their optimal regimes for the best performance, when uncoupled. However, in the presence of the other sensors, this optimization (in the individual units) is lost because of coupling induced interaction. This is a "coupling" loss that can lead to a reduction in performance of the entire sensory system. The performance loss is most evident at smaller inter-sensor intervals (corresponding to higher coupling strength). The overall performance, quantified by a total SNR, is bounded from above by the theoretical (or ideal) limit given by $N \times \Gamma_{N=1}$. This value is approached only in the limit wherein the sensors are, effectively, decoupled; for magnetic field sensors, this would mean that the separation exceeds a critical value past which coupling effects are negligible.

Magnetic field sensors are, inherently non-linear. Some of them actually display an optimal regime of operation wherein the responsivity to a small target magnetic signal is enhanced. Magnetic sensors whose dynamics pass through a critical point to a regime of dynamical (oscillatory) behavior are particularly sensitive when tuned to an optimal operating parameter regime past the critical point, such as just past the value of q=0 shown in FIG. 2. Hence, it is desirable to create a magnetic field sensor that can "self-tune" its dynamics to the optimal operating regime. In this, the sensor behaves biomimetically.

Biological sensory systems are often able to self-tune themselves so that they operate in an optimal regime. A good example is provided by the hair-cells in the cochlea. The hair cells possess a self-tuning mechanism that allows the adaptation of the dynamic range of the cochlea to different levels of input signals; this is a form of automatic gain control. In the absence of input signals the system will increase its coefficient of amplification until the amplified internal noise in the output reaches a significant level. If a signal is, then, applied, both the signal and noise are amplified together so that the total output power is increased but to a small level compared with the signal-less condition. The system is organized so that the strongest signal is amplified with the smallest amplification coefficient. Such a self-tuning mechanism can be formulated for the class of magnetic field sensors that display dynamical behavior past a critical point. In turn, this can significantly enhance the sensor response to external magnetic target signals, in the presence of the sensor noise-floor.

When multiple magnetic field sensors are joined in an array, there are unavoidable coupling effects between elements of the array. These interactions between the sensors lead to a reduction in performance (i.e. a decline in the total output signal-to-noise ratio (SNR)) of the sensory array so that the total SNR has a sub-linear scaling with the number of sensors in the array. Magnetic (and electric) field sensors are unique insofar as an array of these sensors will always be, essentially, coupled. While individual sensors can be shielded from other sensors and the environment, the shielding must be open to the pass-band of the target signal. Hence, any magnetic (or electric) field detection array requires attention to reduce the above-mentioned losses stemming from inter-element coupling.

One route to mitigating these coupling induced losses would be to "cancel" the effects of coupling. In an experimentally accessible scenario, this is accomplished by constructing a global feedback in the coupled magnetometer array. This feedback is applied to the dynamics of every array element; the result is a mitigation of the coupling losses; a full cancellation of these losses is impossible, but the global feedback procedure does, in fact, raise the response SNR of the array to a value close to (but never exceeding) the theoretical limit of best performance.

FIG. 1 shows a magnetic sensor introduced by Takeuchi and Harada (TH sensor), a variant of which (see FIG. 12) may be used in the systems disclosed herein. The TH sensor shows very good sensitivity to weak magnetic fields because it includes a positive magnetic feedback. The embodiments disclosed herein include a modified version of this magnetic field sensor that includes a self-tuning mechanism for tuning to an optimal operating regime. The self-tuning is inspired by the adaptive amplification mechanism that is thought to be mediated by hair-cells in the cochlea, hence the single sensor is "biomimetic". This resulting sensor can achieve a large dynamic range, with a concomitant lower noise-floor, via adaptation to input signals.

In some embodiments, the modified magnetic field sensors are assembled into an array that aims to increase the total array gain and the (total) output SNR. The magnetic sensors are receptors of the target (usually at dc or extreme low frequency) magnetic field; however, they also interact (electromagnetically) with each other when they are placed in an array. These interactions (or coupling) between the sensors leads to a reduction in performance (i.e. a decline in the total output SNR) of the sensory array so that the total SNR has a sub-linear scaling with the number of sensors in the array.

Magnetic (and electric) field sensors are unique insofar as an array of these sensors will generally be coupled. While individual sensors can be shielded from other sensors and the environment, the shielding must be open to the pass-band of the target signal. Hence, any magnetic (or electric) field detection array requires attention to reduce the above-mentioned losses stemming from inter-element coupling.

The disclosed embodiments also include a route for mitigating performance degradation in the array by using a carefully defined global feedback in the sensor array to (partially) cancel the loss terms that stem from the inter-element coupling. This correction has the effect of raising the output SNR (of the array) to a value close to (but not in excess of) the theoretical maximum response SNR. The latter limit is calculated as the sum of the response SNRs of individual elements in the array, assuming zero inter-element coupling.

As shown in FIG. 1, the sensor is a combination of an oscillator through the $L_0C_0$ resonance circuit, and a low-pass filter $R_2C_2$. In the resonance circuit, the inductance $L_0$ is non-linear due to a ferromagnetic core. The power loss in the resonance circuit occurs due to the resistance of the coil and hysteresis in the ferromagnetic core. For self-sustained oscillations, the power loss in the resonance circuit should be compensated by a positive feedback. In the TH sensor, the positive feedback is implemented with the resistance $R_1$, and the inductance $L_1$; the operational amplifier is used as a comparator. In the oscillating magnetic field of the resonance circuit, the ferromagnetic core is periodically saturated. If an external constant magnetic field is applied, the oscillations in the sensor output take on an asymmetric form due to the non-linearity of the ferromagnetic core. Hence the oscillator output averaged by the low-pass filter $R_1C_1$ is different from zero in this case. Here, it is assumed that the oscillations are fully filtered out by the low-pass filter.

Figure 2:
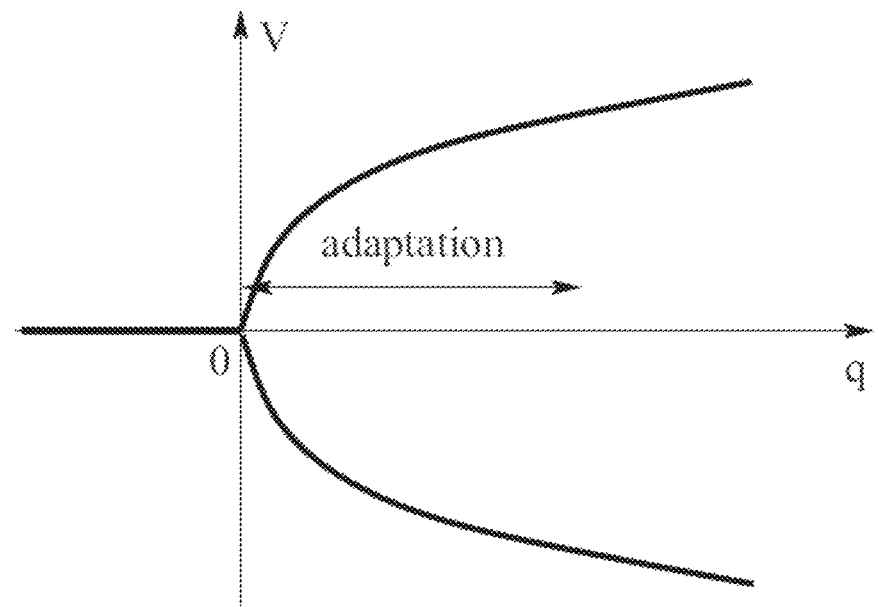
FIG. 2 shows a bifurcation diagram of the Takeuchi and Harada sensor shown in FIG. 1.

The transfer function of the sensor is not monotonic. Disclosed herein is a phenomenological model of the transfer function to simplify the task of analysis of the noisy non-linear system. The transfer function can be, qualitatively, described by the following equation:

$$f(x, q) = \text{sgn}(x)\sqrt{q}\left[1 - \exp\left(-\frac{|x|}{q}\right)\right]\exp\left(-\frac{x^2}{q^2}\right), \quad \text{(Eq. 1)}$$

where x is an applied magnetic field, and q is a parameter characterizing the feedback of the oscillator. It is assumed that $0 \leq q < \infty$. Then, the closer the parameter q is to zero, the smaller is the excitation of the resonance circuit via the feedback. The case q=0 corresponds to the Andronov-Hopf bifurcation in the TH oscillator, as shown in FIG. 2, with the q=0 value being referred to as the "critical point." The parameter V represents the amplitude of the voltage oscillations in the $L_0C_0$ resonance circuit shown in FIG. 1. The parameter q depends on resistor $R_1$ also as shown in FIG. 1. It should be noted that Eq. (1) is not able to describe the Andronov-Hopf bifurcation itself.

Figure 3:
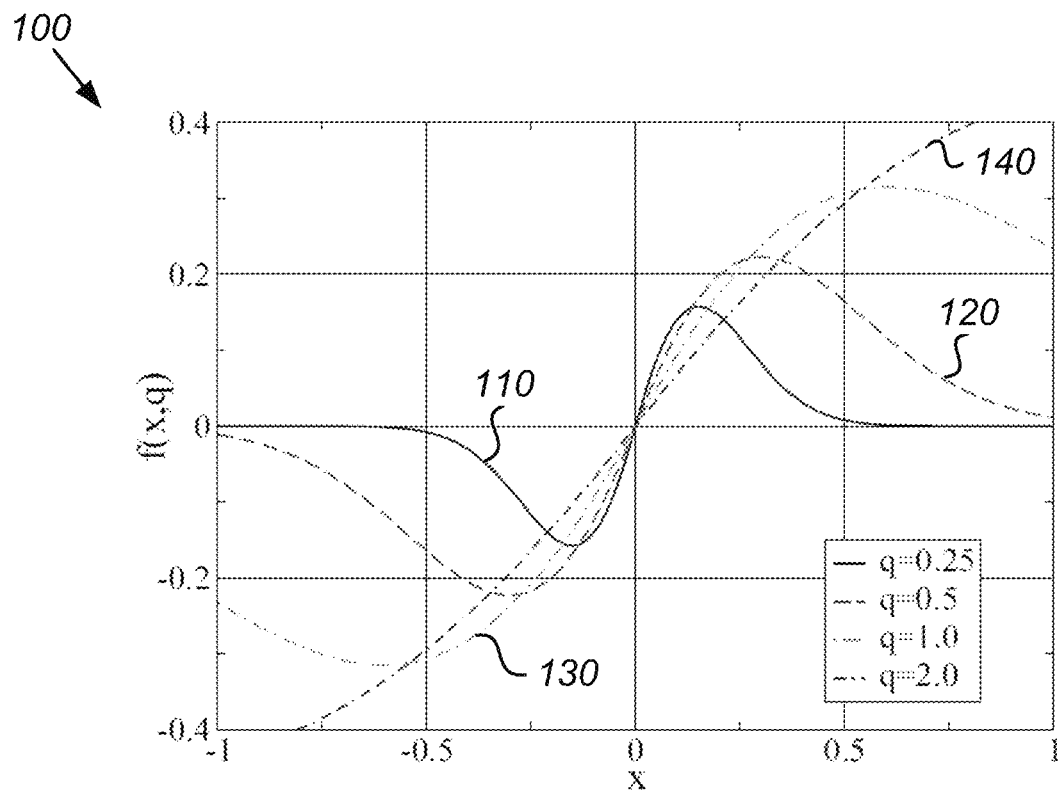
FIG. 3 shows a graph illustrating the transfer function of a sensor model for a specified set of q values.

FIG. 3 shows a graph 100 illustrating the transfer function of a sensor model for a specified set of q values. The q value is a feedback parameter that can be adjusted depending upon the desired shape of the transfer function—i.e. the desired behavior response characteristics of the non-linear dynamic sensor. Line 110 represents the input $f(x,q)$ versus the applied magnetic field x for a value of q=0.25, line 120 represents $f(x,q)$ versus x for a value of q=0.5, line 130 represents $f(x,q)$ versus x for a value of q=1.0, and line 140 represents the $f(x,q)$ versus x for a value of q=2.0. As shown, when the value of q increases, the regime of linearity of the transfer function becomes greater.

The sensor can be characterized by the maximal value of the coefficient of amplification, and the dynamic range. According to Eq. (1), the coefficient of amplification of the sensor is $k_q = f(x,q)/x$. The maximal value of the coefficient of amplification can be found, in the limit x→0, as $k_{q,max}=1/\sqrt{q}$. In practice, sensors are usually exploited in a range of inputs wherein their transfer functions are almost linear functions of the (small) input signals. Therefore, the dynamic range of the sensor can be defined as the range of x where the transfer function $f(x,$ deviates from the linear function $F(x,q)=k_{q,max}x$ up to a small parameter $\delta$, $$|F(x,q)-f(x,q)|<\delta, \delta>0. \quad \text{(Eq. 2)}$$

Since $\delta$ is small, the transfer function can be well approximated by the cubic equation $$f(x,q)\cong ax^3+bx^2+cx+d. \quad \text{(Eq. 3)}$$

From the symmetry of the transfer function $f(x,q)=-f(-x,q)$, it follows that b=0=d. In the limit of small values of x, the transfer function becomes almost linear $f(x,q)\cong cx$, so that $c=k_{q,max}$. Therefore, $$|F(x,q)-f(x,q)|\cong |ax^3|, \quad \text{(Eq. 4)}$$

just outside the linear regime of the transfer function. One readily observes that (i) the parameter q controls both the dynamic range and the coefficient of amplification and (ii) the dynamic range narrows faster than the amplification coefficient increases.

From this brief analysis it follows that it is possible to reach very high values of the coefficient of amplification (i.e., high sensitivity to weak signals) close to the limit q→0. This is precisely a risk of failure in the sensor operation due to it being poised on the brink of the Andronov-Hopf bifurcation. In this limit, however, the internal noise plays a very important role in the sensor dynamics because it is amplified by the sensor either instead of or with the target signal. In the output of the TH sensor, the noise $\xi(t)$ is colored (i.e., correlated with correlation time $\tau_\xi$) because it is passed via a low-pass filter of first order with large time constant. Previously, we had introduced the non-inertial and noise-less transfer function Eq. (1). To describe the noise dynamics of the sensor it is assumed that noise is present at the input of the model, $x=s+\xi(t)$, where s is a target dc magnetic field. The noise can be represented by the Ornstein-Uhlenbeck (OU) process, $$\tau_\xi \frac{d\xi}{dt} = -\xi + \sqrt{2D}\,\eta(t), \quad \text{(Eq. 5)}$$

with correlation function $$\langle \xi(t_1)\xi(t_2)\rangle = \sigma_\xi^2 \exp\left(-\frac{|t_1-t_2|}{\tau_\xi}\right), \quad \text{(Eq. 6)}$$

where $\tau_\xi$ and $\sigma_\xi^2=D/\tau_\xi$ are the correlation time and the variance of the OU process correspondingly, $\eta(t)$ is a Gaussian white noise with zero mean $\langle\eta(t)\rangle=0$ and correlation function $\langle\eta(t_1)\eta(t_2)\rangle=\delta(t_1-t_2)$, with 2D being the noise intensity. For practical applications, the input values $(s+\xi(t))$ should be set up inside the dynamic range of x. Therefore, the relationship between the noise level and the dynamic range should be $\sigma_\xi<\delta^{1/3}q^{5/6}$ or, for simplicity, $\sigma_\xi<\delta^{1/3}q$. Hence, the coefficient of amplification must be bounded from above as $k_{q,max}^2<\delta^{1/3}/\sigma_\xi$.

Figure 4:
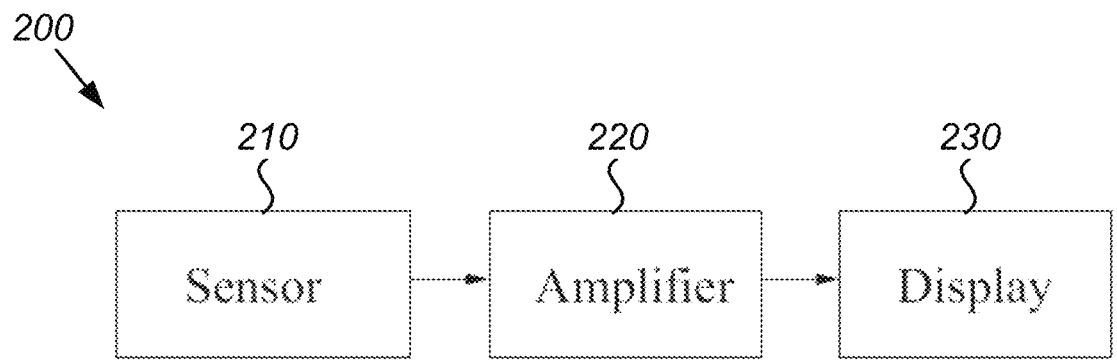
FIG. 4 shows a diagram illustrating components for an embodiment of a sensor system in accordance with the disclosed embodiments.

If the target magnetic field s is too weak or too strong, the sensor output could be out of the dynamic range of the display or another readout device. Therefore, some embodiments of a system as disclosed herein incorporate an amplifier. For example, system 200 shown in FIG. 4 includes a sensor 210, an amplifier 220, along with a display 230 connected thereto. In the case of a weak output of sensor 210, when its value is comparable with the input noise of amplifier 220, amplifier 220 will amplify both the output of sensor 210 and its own internal noise, $$v=k_a(f(s+\xi,q)+\xi_a), \quad \text{(Eq. 7)}$$

where $k_a$ is the coefficient of amplification of amplifier 220, v its output, and $\xi_a$ the input noise of amplifier 220. With the assumption $f(x,q)\cong k_q(x+\xi)$, we obtain $$v=k_a(k_q s+k_q\xi+\xi_a). \quad \text{(Eq. 8)}$$

Now, it is easy to obtain the output signal-to-noise ratio, $$\Gamma_{out}=\frac{\langle v\rangle^2}{\sigma_v^2}=\frac{s^2}{\sigma_\xi^2+\sigma_{\xi_a}^2/k_q^2}. \quad \text{(Eq. 9)}$$

Here $\langle v\rangle$ is the mean value of the output; $\sigma_v^2$ and $\sigma_{\xi_a}^2$ are the variances of the output and noise of amplifier 220 correspondingly.

The last equation shows the output SNR to be monotonically decreasing with increasing $k_q$. In the limit of very high $k_q$, the SNR at the output of the measurement system approaches the SNR at the input of sensor 210. Therefore, to improve the SNR of the complete measurement system we need to increase the coefficient of amplification of sensor 210, $k_q$, as much as possible.

In the auditory system, a self-tuning mechanism allows an adaptation of the dynamical range of the system to different levels of input signals. In the absence of input signals the system will increase its coefficient of amplification until the amplified internal noise in the output reaches a significant level. If a signal is then applied, both the signal and noise are amplified together so that the total output power is increased but to a small level compared with the signal-less condition. The system is organized so that the strongest signal is amplified with the smallest amplification coefficient.

The disclosed embodiments use a self-tuning mechanism with similar properties for the realization of the TH sensor. For signal and noise inside the dynamic (working) range, the output power of the sensor can be estimated as $$\hat{\psi}=\langle [f(s+\xi(t),q)]^2\rangle. \quad \text{(Eq. 10)}$$

In this equation the existence of an ensemble of sensors is tacitly assumed so the ergodic hypothesis can be used for an estimation of the (average) power. Moreover, the infinite interval of time (over which the averaging is done) is replaced with a finite interval T, $$T\frac{d\psi}{dt}=-\psi+[f(s+\xi,q)]^2. \quad \text{(Eq. 11)}$$

For sufficiently large T, this provides a good estimator of the power, $\hat{\psi}\cong\psi$.

To use the entire dynamic range of the sensor, the power provided by the input signal should be close or equal to the boundary of the dynamic range of the sensor, $$\langle x^2\rangle=[\delta^{1/3}q^{5/6}]^2\cong \delta^{\frac{2}{3}}q^2.$$

In this case, taking into account the quasilinear character of the function $f(x,q)$ in the dynamic range, the power of the output can be estimated as $$\tilde{\psi} = [f(\sqrt{\langle x^2 \rangle}, q)]^2 = [f(\sqrt[3]{\delta}\, q, q)]^2 \cong [k_{q,max} \delta^{\frac{1}{3}} q]^2 = q\delta^{-2/3}. \quad \text{(Eq. 12)}$$

Hence the value of the parameter $q=\psi\delta^{-2/3}$ indicates an optimal usage of the dynamic range of the sensor. Now, the self-tuning mechanism for the model of the sensor can be described by the equation $$\tau \frac{dq}{dt} = -q + \psi\delta^{-\frac{2}{3}}, \quad \text{(Eq. 13)}$$

where $\tau$ is the tuning time. It is assumed that the tuning time $\tau$ is equal to or greater than the averaging time T, i.e., $\tau \geq T$. Equations (1), (5), (10) and (13) are the model of the sensor with the tuning mechanism.

The tuning is produced to expand or shrink the dynamic range to an efficient width of the signal distribution. The optimally tuned sensor means that the dynamic range is used efficiently, i.e. the dynamic range equals to the width of the signal distribution. Accordingly, if the signal is weak, the parameter q should approach zero, and if the signal is strong the parameter q should be increased. The self-tuning is set up such that the dynamic range is adjusted to the signal and the noise present.

Figure 5:
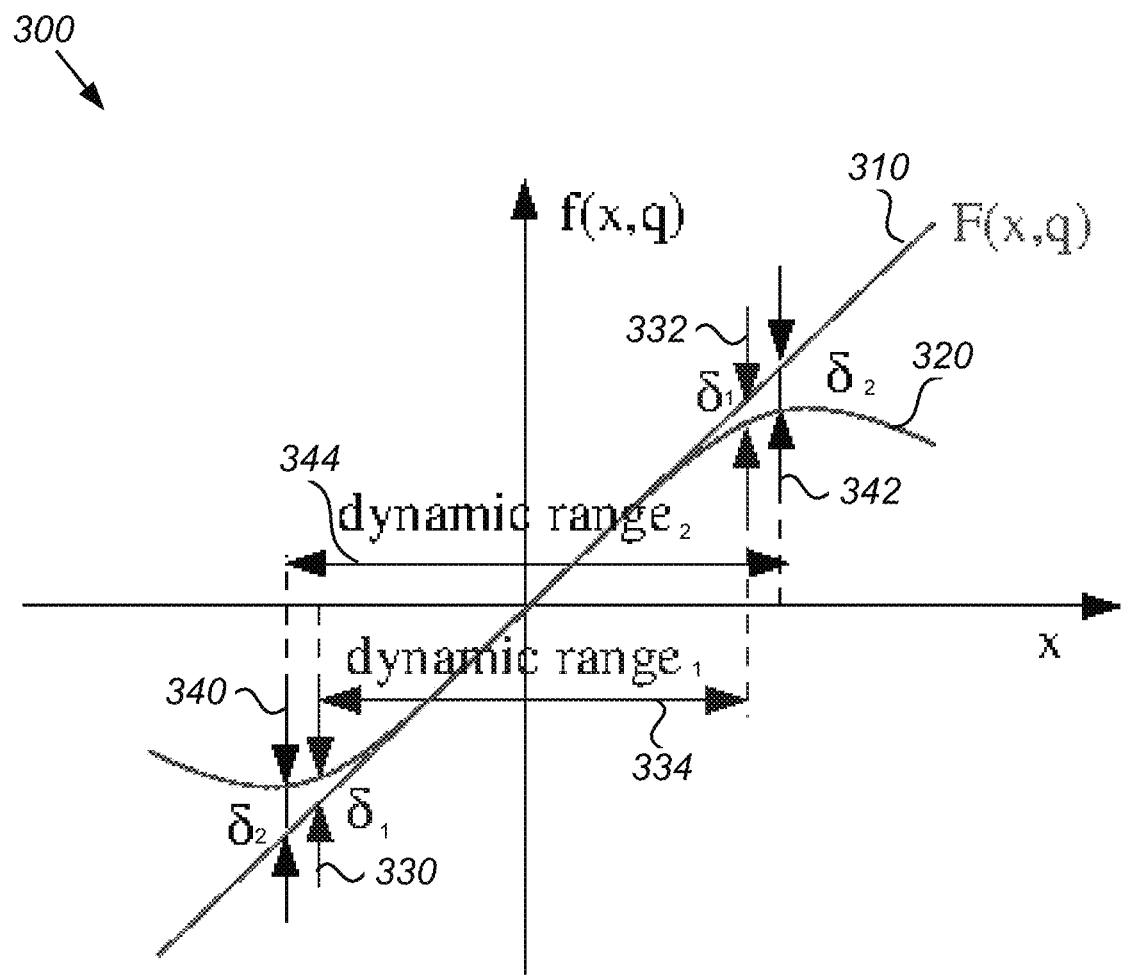
FIG. 5 shows a diagram illustrating the variation of the sensor dynamic range for different chosen delta values.

FIG. 5 shows a diagram 300 illustrating the variation of the sensor dynamic range for different chosen values of the parameter $\delta$. As shown, line 310 represents $F(x,q)$, which is a pre-selected linear function. Line 320 represents the transfer function $f(x,q)$, which deviates from $F(x,q)$ up to a small parameter $\delta$. For a first $\delta$ value, $\delta_1$, as shown by arrows 330 and 332, the corresponding dynamic range is shown by arrow 334. For a larger $\delta$ value, $\delta_2$, as shown by arrows 340 and 342, the corresponding dynamic range is shown by arrow 344. The second dynamic range is larger, as is expected with a higher $\delta$ value. Similarly, a smaller $\delta$ value decreases the dynamic range.

Figure 6:
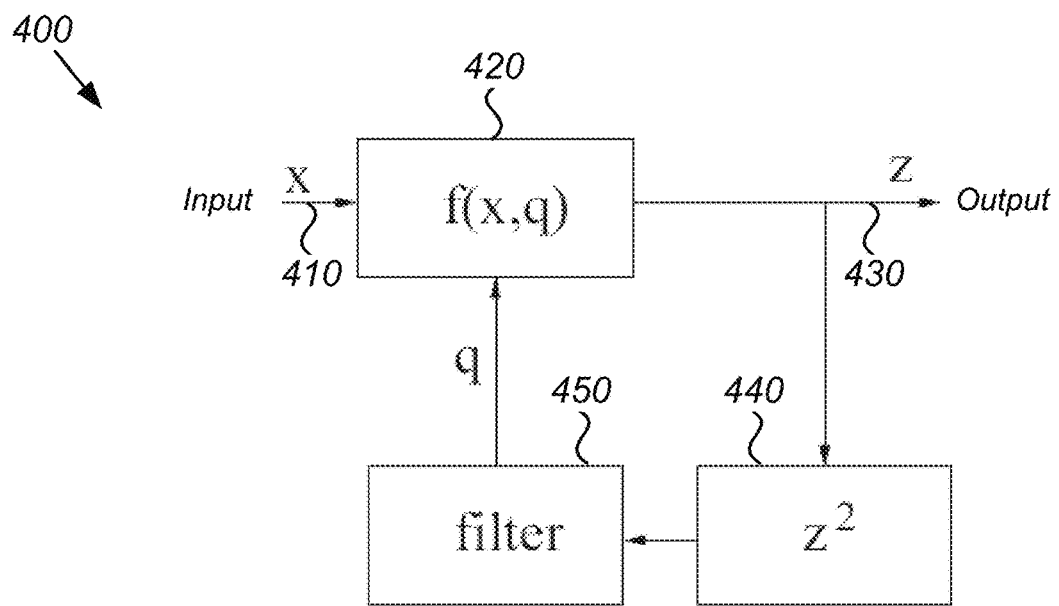
FIG. 6 shows a block diagram illustrating the processing for an embodiment of an adaptive sensor system in accordance with the disclosed embodiments.

FIG. 6 shows a diagram 400 illustrating one possible setup of the adaptive sensor system in accordance with the disclosed embodiments. As shown in FIG. 6, the input x 410 is transformed at box 420 using the transfer function $f(x,q)$ into the output z 430. The output z 430 is passed via a non-linear unit 440 (to obtain $z^2$) and a linear low-pass filter 450 to control the parameter q in the transfer function $f(x,q)$.

Figure 7:
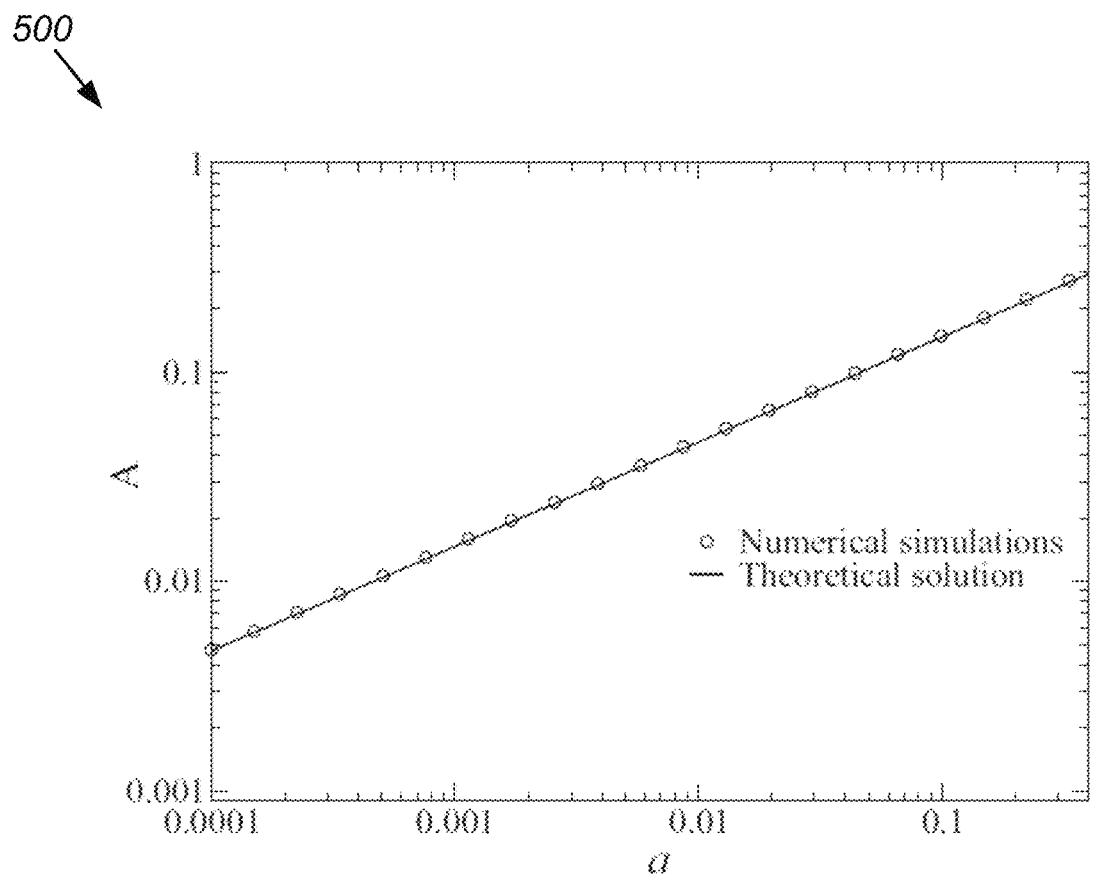
FIG. 7 shows a graph illustrating the input/output characteristics of an adaptive sensor system incorporating the processing shown in FIG. 6.

In FIG. 7, a graph 500 of the input-output characteristic of the adaptive system is shown. The "compression" is readily visible. Weak signals are amplified, but strong signals are attenuated. In FIG. 7, the periodic input signal is $x=a \cos \Omega t$. The variable A is the amplitude of the main harmonic in the output. It is found as $$A = \sqrt{A_1^2 + B_1^2},$$

where $$A_1 = \frac{1}{\pi/\Omega} \int_0^{2\pi/\Omega} z \cos(\Omega t)\, dt \text{ and}$$

$$B_1 = \frac{1}{\pi/\Omega} \int_0^{2\pi/\Omega} z \sin(\Omega t)\, dt$$

via simulations of Eqs. (1), (5), (10), and (12) with the parameters $\Omega = 2\pi \times 0.01$, $\delta = 0.01$, and $T = \tau = 10$. The theoretical solution was obtained using Eq. (17) below.

The transfer function of the sensor is evaluated using a linear approximation. The true $\psi$ with its estimate $\overline{[f(x,q)]^2}$. Then, by assumption, the parameter q is stationary and Eq. (13) can be rewritten as $$q = \overline{[f(x,q)]^2} \delta^{-\frac{2}{3}}. \quad \text{(Eq. 14)}$$

Next, we substitute the linear approximation $f(x,q) \cong x/\sqrt{q}$ into the previous equation to obtain $$q = \frac{\delta^{-2/3}}{q} \overline{x^2}. \quad \text{(Eq. 15)}$$

This, immediately, leads to $$q = \delta^{-1/3}\sqrt{\overline{x^2}}, \quad \text{(Eq. 16)}$$

whence the transfer function is obtained as $$z = f(x,q) \cong \frac{x}{\sqrt{\overline{x^2}}} \delta^{1/6}. \quad \text{(Eq. 17)}$$

According to the last expression, if the signal is a periodic function $a \cos(\omega t)$, then the amplitude is $$A = \sqrt{a}\delta^{1/6}. \quad \text{(Eq. 18)}$$

In the TH sensor, the positive feedback (a resistor-inductor circuit) passes the oscillating signal component, as well as the dc component [that is proportional to $f(x,q)$], to the primary coil of the magnetic sensor. Hence the magnetic sensor creates a "self" magnetic field that interferes with the target magnetic field s. The magnetic field of the sensor is proportional to $f(x,q)$, $$\phi(t) \propto f(s+\xi, q). \quad \text{(Eq. 19)}$$

Since the oscillator voltage [proportional to $f(x,q)$] is applied to a resistor-inductor circuit at very low frequency, the impedance of the inductor $L_1$ is very small. Hence the value of the current (and magnetic field) in the $RL_1$ circuit is mainly controlled by the resistor R and is proportional to $\sqrt{q}$. The output of the array is $$Z = \sum_{j=1, i \neq j}^{N} \alpha_{i,j} \sqrt{q_j}\, z_j. \quad \text{(Eq. 20)}$$

The design of the sensor with the tuning feedback leads to the independence of the output of the sensor when the signal is truly constant (which in practice is never the case). Therefore, a target field s is observed that is time dependent. To characterize the performance of the system, the signal-to-noise ratio at the output of the array is estimated below.

For a periodic signal a cos($\Omega$t) at the input, the output of the sensor, z, contains a periodic component A cos($\Omega$t+$\theta$). Computer simulations show that the phase $\theta$ is close to zero for a broad range of parameters of the system. Therefore, it can be ignored and the output is assumed to be A cos($\Omega$t).

The amplitude A can be found via the Fourier transform, $$A = \frac{2}{T_p}\int_0^{T_p} z(t)\cos(\Omega t)dt, \qquad \text{(Eq. 21)}$$

where $$T_p = \frac{2\pi}{\Omega}.$$

Since $$\frac{s(t)}{a} = \cos(\Omega t),$$

the last expression can be rewritten as $$A = \frac{2}{T_p}\frac{1}{a}\int_0^{T_p} z(t)s(t)dt. \qquad \text{(Eq. 22)}$$

The total power at the output is $\overline{z^2}$. The power in the periodic component in the output is $P_s = A^2/2$. Thus the noise power is $P_n = \overline{z^2} - P_s$. Now, the signal-to-noise ratio is introduced as, $$\Gamma = \frac{P_s}{P_n} = \frac{\frac{A^2}{2}}{\overline{z^2} - \frac{A^2}{2}} = \frac{\frac{A^2}{2\overline{z^2}}}{1 - \frac{A^2}{2\overline{z^2}}}. \qquad \text{(Eq. 23)}$$

Here, $$\frac{A^2}{2\overline{z^2}} = \frac{\overline{|z(t)s(t)|}^2}{\frac{a^2}{2}\overline{z^2}}. \qquad \text{(Eq. 24)}$$

Assuming $\overline{z}=0$ and $\overline{s}=0$, the last expression can be rewritten as $$\frac{A^2}{2\overline{z^2}} = \frac{[\overline{zs} - \overline{z}\overline{s}]^2}{(\overline{s^2}-[\overline{s}]^2)(\overline{z^2}-[\overline{z}]^2)} = C^2. \qquad \text{(Eq. 25)}$$

Here, the coefficient C that bears the hallmarks of a correlation coefficient is introduced. In terms of C, the SNR can be expressed as $$\Gamma = \frac{C^2}{1-C^2}. \qquad \text{(Eq. 26)}$$

It is noted that the coefficient C describes the statistical dependence of the output of the array Z on the target field s, $$C = \frac{\overline{Zs} - \overline{Z}\overline{s}}{\sigma_Z \sigma_s}, \qquad \text{(Eq. 27)}$$

where $\sigma_Z^2 = \overline{Z^2} - (\overline{Z})^2$, $\sigma_s^2 = \overline{s^2} - (\overline{s})^2$, and the overline denotes the time averaging $\overline{s} = (t_2-t_1)^{-1}\int_{t_1}^{t_2} s\, dt$ and $\overline{s^2} = (t_2-t_1)^{-1}\int_{t_1}^{t_2} s^2\, dt$. Here, it is assumed that $(t_2-t_1) \to \infty$. The structure of Eq. (26) is similar to a correlation coefficient. Indeed, the difference arises through the form of the averaging: time averaging is used in Eq. (27), and ensemble averaging is used in the correlation coefficient. Therefore, Eq. (27) and the correlation coefficient could, in general, yield different results (due to the difference in averaging) when s is nonstationary.

Before considering the form of the RE in the embodiments of the system disclosed herein, it is necessary to compute an ideal (or theoretical) limit for the net SNR resulting from an uncoupled array (meaning the separation L becomes extremely large) of identical sensors. With only a single sensor, and a very weak periodic signal $s = a\sin(\Omega t)$, we can use a linear approximation, $Z_1 = k_q(s+\xi)$, for the transfer function. According to Eq. (27) the coefficient C is $$C_1^2 = \frac{k_q^2 \frac{a^4}{4}}{k_q^2 \frac{a^2}{2}\left(\frac{a^2}{2}+\sigma_\xi^2\right)} = \frac{\frac{a^2}{2}}{\frac{a^2}{2}+\sigma_\xi^2} \qquad \text{(Eq. 28)}$$

The signal-to-noise ratio can then be rewritten as $$\Gamma_1 = \frac{a^2/2}{\sigma_\xi^2}. \qquad \text{(Eq. 29)}$$

The output of an array of N sensors for a weak periodic signal can be written, in the linear approximation, as $$Z_N = k_q\left(N s + \sum_{i=1}^N \xi_i\right). \qquad \text{(Eq. 30)}$$

The coefficient C takes on the form $$C_N^2 = \frac{\frac{a^2}{2}}{\frac{a^2}{2} + \frac{\sigma_\xi^2}{N}}, \qquad \text{(Eq. 31)}$$

where we assume a statistical independence of the noises $\xi_i$. From Eq. (29) and Eq. (31), it follows that $$\Gamma_N = N\Gamma_1. \qquad \text{(Eq. 32)}$$

This allows us to predict a theoretical dependence of the signal-to-noise ratio for an array with N units if $\Gamma_1$ is known, for the "ideal" case of widely separated sensors (i.e., the coupling is negligible).

Figure 8:
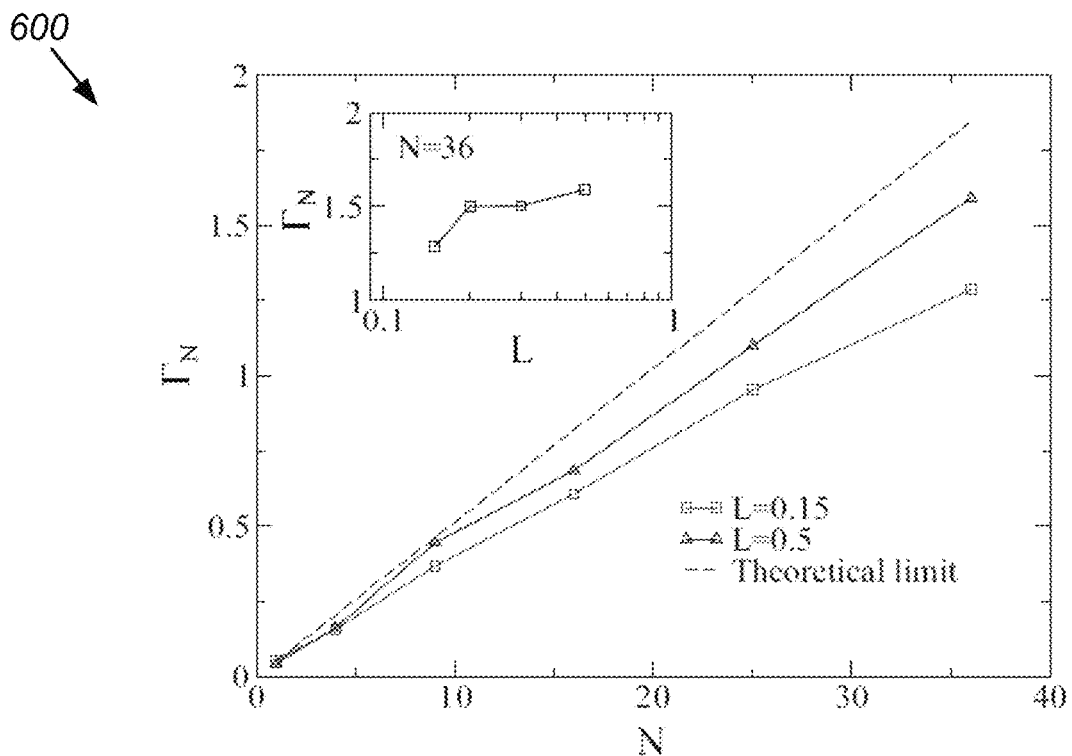
FIGS. 8 and 9 show graphs illustrating the Ringelmann effect in an array of sensors, with different parameters.
Figure 13A:
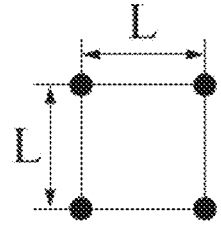
FIGS. 13A and 13B show diagrams illustrating sensor array configurations.
Figure 13B:
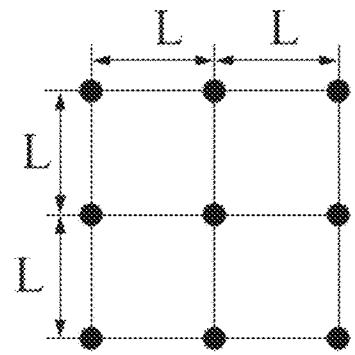

FIG. 8 shows a graph 600 illustrating the Ringelmann effect in an array of sensors. The $SNR_N$ is shown as a function of the number N of sensors in the array. The array is organized into square lattices (see FIGS. 13A and 13B) with the inter-sensor intervals L. The target field is the weak periodic signal x=a sin($\Omega$t), where a=0.001 and $\Omega$=2$\pi$×0.01. The noises $\xi_i$(t) are independent OU stochastic processes. The theoretical dependence is shown with the dashed line and was found using Eq. (24). It is evident that the obtained results are always below the theoretical capacity. This is a sign of the Ringelmann effect in the coupled array. The inset shows a clear increase in the summed SNR response (for fixed N=36) as the sensor separation in the array increases, corresponding to a lower coupling strength.

Graph 600 in FIG. 8 shows that, in the case of a weak periodic signal, the performance of the sensory system is better when the inter-sensor intervals are longer (weak coupling). It is easy to see that the obtained results are always below the capacity defined as the theoretical dependence. If the periodic signal is strong (see graph 700 in FIG. 9), the dependence of the SNR on the inter-sensor spacing is also strong. Graph 700 shows the Ringelmann effect in the array of sensors with the same parameters as in graph 600, but with a=0.01.

One readily finds that the amplitude of the output increases with the amplitude of the input signal (see Eq. (17)). This means that the increased amplitude of the input signal leads to an increase in the magnetic field created by the sensor and, hence, to an increased strength of the interactions between the sensors. Every sensor in the array amplifies both the target signal and the magnetic field of other sensors of the array. The unwanted positive feedback stemming from coupling between the sensors "confuses" their tuning mechanisms so that the amplitude A of the array output is greater than expected (see graph 800 in FIG. 10), and the magnitude of the inputs of the sensors can be outside the working dynamic range. Therefore, the sensors become non-linear systems that pass the signal with a nonlinear distortion.

Figure 10:
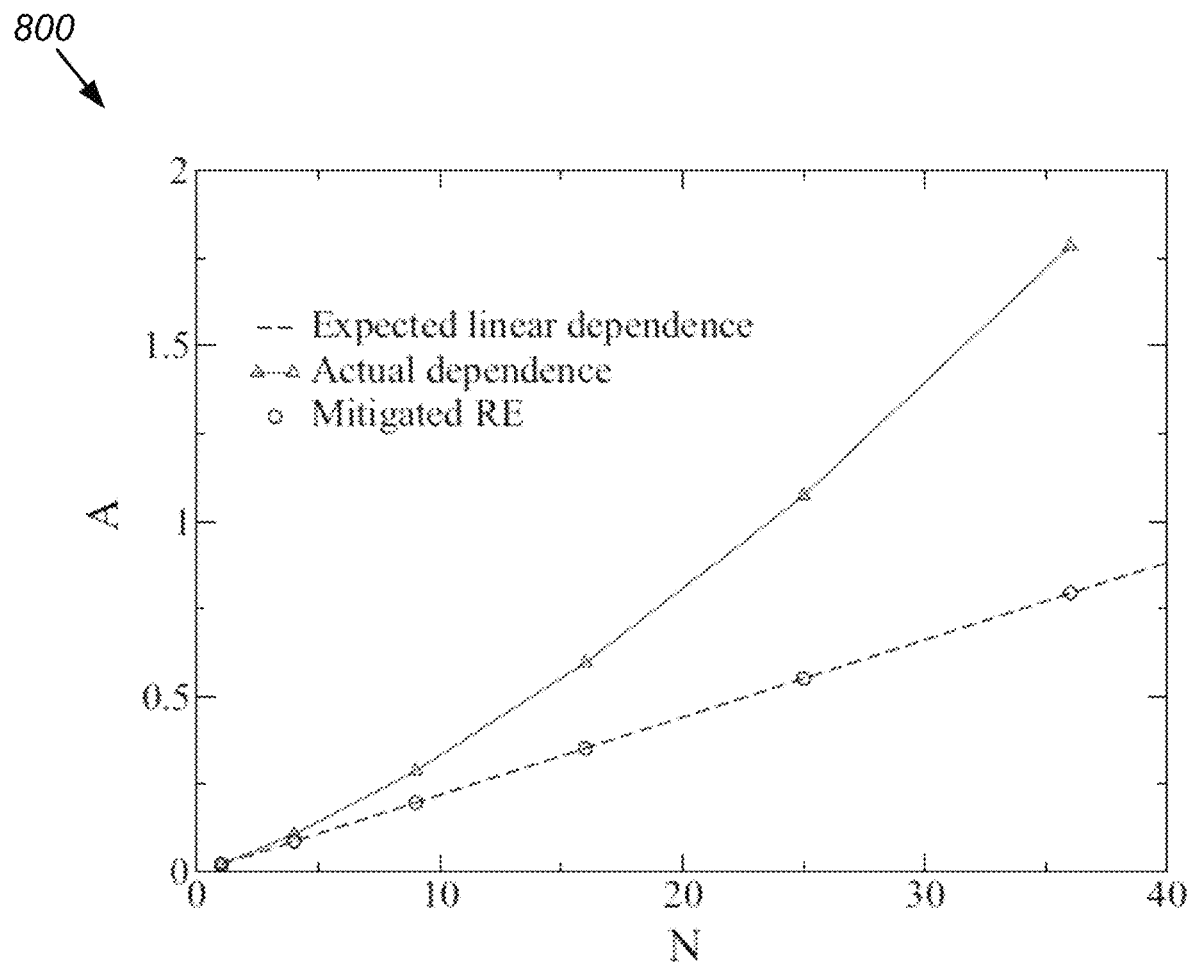
FIG. 10 shows a graph illustrating the synergetic effect of the coupling on the gain in a sensor array.

FIG. 10 shows a graph 800 illustrating the synergetic effect of the coupling on the gain in the array. Here, A is the output amplitude of the array. The periodic input signal is x=cos $\Omega$t. Parameters include $\Omega$=2$\pi$×0.01, a=0.01, $\delta$=0.01, T=$\tau$=10, and L=0.18. The expected theoretical dependence was obtained with Eq. (18) and the assumption that the amplitude is A=N×A$_0$, where A$_0$ is the amplitude of the unit (of the array) performing alone.

From the SNR definition in Eq. (26), the higher harmonics of the signal make a contribution to the noise in the outputs of the sensors, so that the SNR is reduced. It is easy to see that $$\Gamma_{actual} < \Gamma_{expected} \equiv \sum_{i=1}^{N} \Gamma_{i,alone}, \ i = 1 \ldots N. \quad \text{(Eq. 33)}$$

The inequality Eq. (33) satisfies the definition of the RE, with the one caveat: instead of the maximal productivity, we use the SNR in the system as a performance measure. The SNR is almost the same whether the sensor is optimally tuned or not, as long as the input x of the transfer function $f$(x,q) is within the dynamic range. Hence the maximum SNR is equivalent to the optimal SNR. Therefore, the term "Ringelmann effect" may be used in the context of the reduction of the SNR in the array of sensors.

Figure 9:
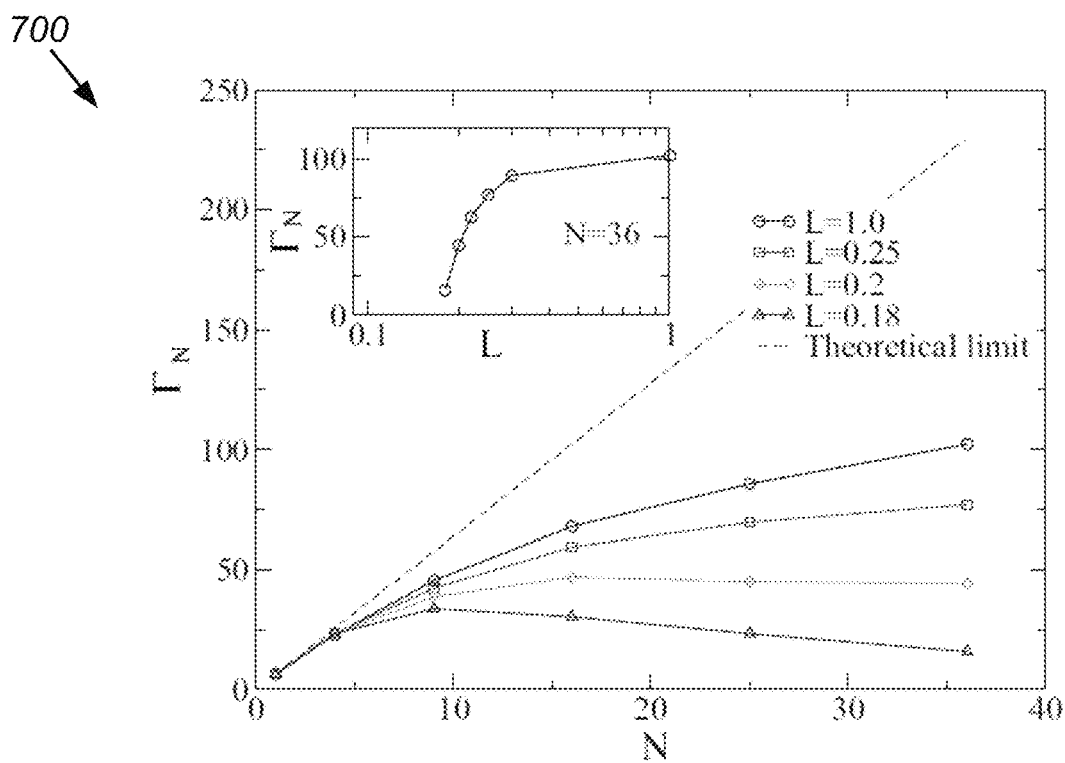

In contrast to FIG. 8, FIG. 9 shows that the SNR is a non-monotonic function of the number of the units in the array. In fact, there arises a situation wherein the number of mutual interactions grows faster than the number of units in the array. Every interaction makes its individual contribution to the positive feedback of the system and increases strength of the interactions.

The inset shown in FIG. 9 shows that the reduction of the inter-sensor intervals L (meaning an increase in the coupling strength) leads to a reduction of the performance of the sensory system, i.e., the SNR rapidly drops. Obviously, there is a critical L that corresponds to a transition of the system behavior from the amplification of the external magnetic fields to the generation of a spontaneous magnetic field magnetization) that is mostly independent of external fields. An analogous effect is apparent as a function of N (see FIG. 9). For strong coupling (small separation L), the "self" fields (arising from the spontaneous magnetization of the core) of each sensor are amplified far more than the external magnetic field. In the large L (i.e., weak coupling) limit the response approaches the theoretical maximum, particularly for weak target signals. These two regimes are, loosely, connected via a maximum in the SNR versus N curve as visible in FIG. 9. As N decreases, the maximum shifts to a lower N value.

To illustrate the influence of the coupling on the sensory system we consider a square matrix consisting of sensor elements that have the individual SNRs, $$\Gamma_{m,n} = \frac{c_{m,n}^2}{1 - c_{m,n}^2}, \quad \text{(Eq. 34)}$$

where the coefficients $c_{m,n}$ are $$c_{m,n} = \frac{\overline{z_{m,n} s} - \overline{z_{m,n}} \overline{s}}{\sigma_{z_{m,n}} \sigma_s}, \quad \text{(Eq. 35)}$$

where $z_{m,n}=f(s+\xi_{m,n} q_{m,n})$, m=1, ..., $\sqrt{N}$, and n=1, ..., $\sqrt{N}$.

We now consider the (numerical) results for the almost independent sensors, i.e., the sensors are weakly coupled due to the long inter-sensor intervals (we take L=1 for this case). It is easy to see that the individual signal-to-noise ratios $\Gamma_{m,n}$ in all matrices are almost identical and close to value of the SNR of the single sensor (N=1). This is illustrated by using a strong signal (amplitude a=0.01) and computing, for a single sensor, $\Gamma_1$=6.326391. For a 2D square lattice of varying size, we can calculate the individual signal-to-noise ratios $\Gamma_{m,n}$ as follows:

$$N = 4: \begin{pmatrix} 6.159971 & 6.433196 \\ 6.456477 & 6.349792 \end{pmatrix}$$

Total $\Gamma_4$ is 22.818512.

$$N = 9: \begin{pmatrix} 6.297275 & 6.458169 & 6.403746 \\ 6.374942 & 6.431465 & 6.333464 \\ 6.556485 & 6.643418 & 6.327900 \end{pmatrix}$$

Total $\Gamma_9$ is 45.484923, and so on. It is easy to see that the total SNR is less than the sum of all SNRs, i.e., much redundant information passes through the sensory system.

Another illustrative example can be considered, wherein the coupling is strong due to the short inter-sensor intervals, L=0.18. As in the preceding case we can calculate $\Gamma_1$=6.234534 for a single element. In this case, we find, as above, the following.

$$N = 4: \begin{pmatrix} 11.158677 & 11.292682 \\ 11.451936 & 11.118461 \end{pmatrix}$$

Total $\Gamma_4$ is 23.293699.

$$N = 9: \begin{pmatrix} 14.360633 & 16.886906 & 14.651738 \\ 16.707638 & 19.346849 & 17.575212 \\ 14.750152 & 16.593489 & 15.213220 \end{pmatrix}$$

Total $\Gamma_9$ is 33.708725.

The sensors are "cooperating". The individual SNRs are greater than the SNR of the single sensor, and correlations between the individual responses of the sensors and the external signal are increased. But, the cooperative work counters the performance of the whole system; the total SNR is (for increasing N) below that of the weakly coupled sensors (the previous case for L=1), with correlations between individual responses being increased in this case.

According to FIGS. 8 and 9, the RE can be mitigated by increasing the element separation L in the sensory array. But, in this case the size of the array will either become prohibitively large or result in sensors picking up different spatially localized signals. Hence an alternative way of reducing the RE is required.

Since the RE takes place due to the coupling between the sensory units we could, at least on paper, cancel the coupling to improve the SNR response of the array. However, in contrast to the mathematical model, the simple "cancellation of the coupling term" is usually impossible in a real sensory system. Therefore, we construct the canceling term $\Phi_{c,i}$ to the coupling term $\phi_i$ from data available from measurements in a possible real experiment; ideally, the canceling term should be $\Phi_{c,i}=-\phi_i$. In keeping with our desire to achieve the mitigation of the RE through realistic (i.e., experimentally accessible) scenarios, however, we assume that it is impossible to measure the quantity $\phi_i$. According to the following equation $$\phi_i \cong \sum_{j=1, i \neq j}^{N} \alpha_{i,j} \sqrt{q_j} \, z_j, \quad (Eq. 36)$$

this quantity can be estimated from a knowledge of the parameters g, $l_{i,j}$, $q_i$, and $z_i$. For simplicity, we will assume that the dynamics of all parameters $q_i$ are similar and all $q_i$ take on almost the same values, $q_i \approx q_j$. Then the canceling term will be $$\Phi_{c,i} = -g\sqrt{q_i} \sum_{j=1, i \neq j}^{N} \frac{z_j}{l_{i,j}}, \quad (Eq. 37)$$

where $z_j$ is the output of the jth unit. The following equation $$z_i = f(s + \xi_i(t) + \phi_i) q_i \quad (Eq. 38)$$

can be rewritten as $$z_i = f(s + \xi_i(t) + \phi_i + \Phi_{c,i}) q_i. \quad (Eq. 39)$$

Figure 14:
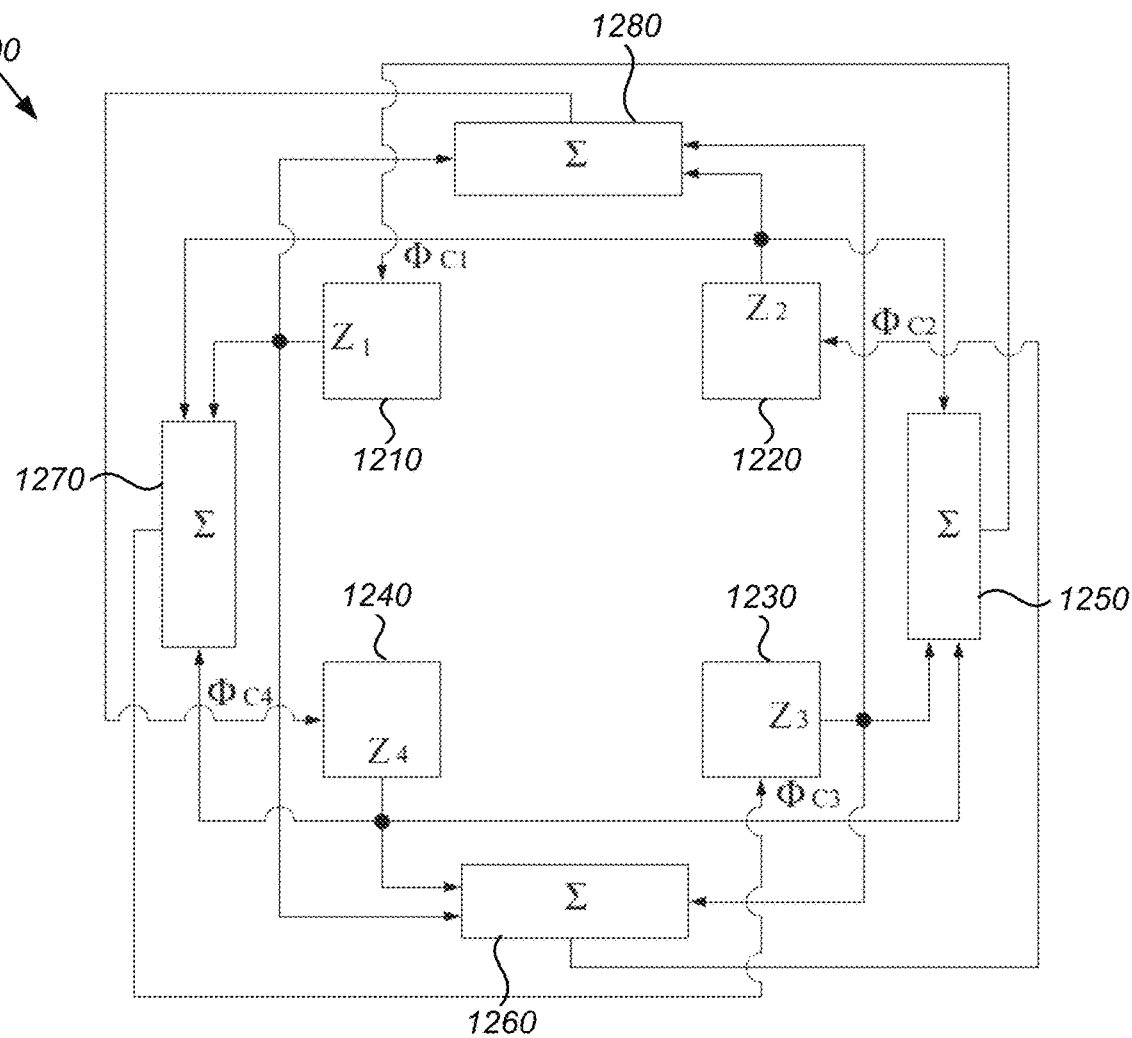
FIG. 14 shows a diagram illustrating the connection of an array of four sensors with global feedback in accordance with the disclosed embodiments.

The term $\Phi_{c,i}$ in Eq. (39) implies a global feedback in the sensory system, as shown in FIGS. 12 and 14.

Figure 11:
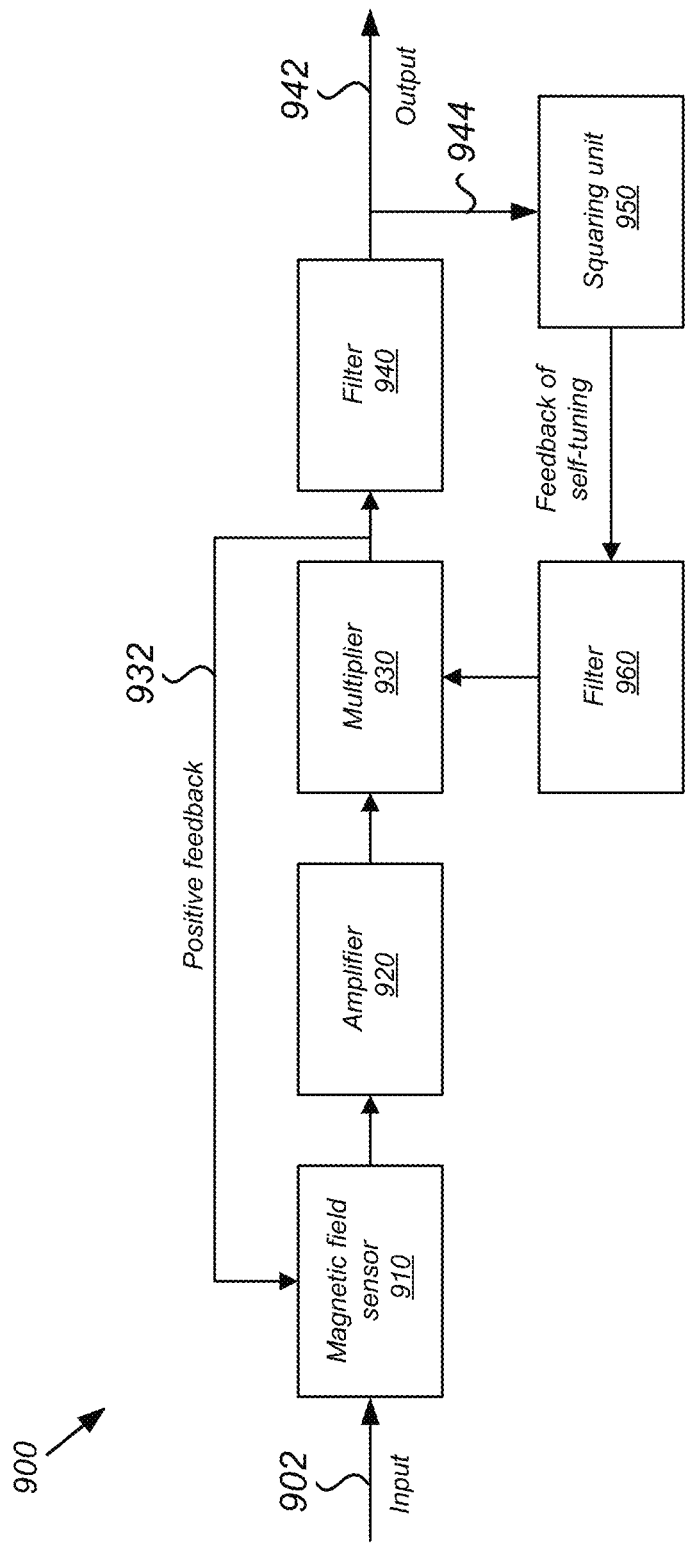
FIG. 11 shows a diagram illustrating an embodiment of a sensor system in accordance with the disclosed embodiments.

FIG. 11 shows a diagram illustrating an embodiment of a sensor system 900 in accordance with the disclosed embodiments. As shown, an input signal 902 is sensed by magnetic field sensor 910. The sensed signal is then amplified by amplifier 920. The output of amplifier 920 is passed to multiplier 930. A positive feedback signal 932 is sent from multiplier 930 back to magnetic field sensor 910. Multiplier 930 also sends a signal to filter 940, which outputs an output signal 942. A signal 944 from filter 940 also is routed to a non-linear squaring unit 950, which is part of the self-tuning process. Squaring unit 950 passes a signal to filter 960, the output of which is then routed to multiplier 930 for combination with the incoming signal from amplifier 920.

Figure 12:
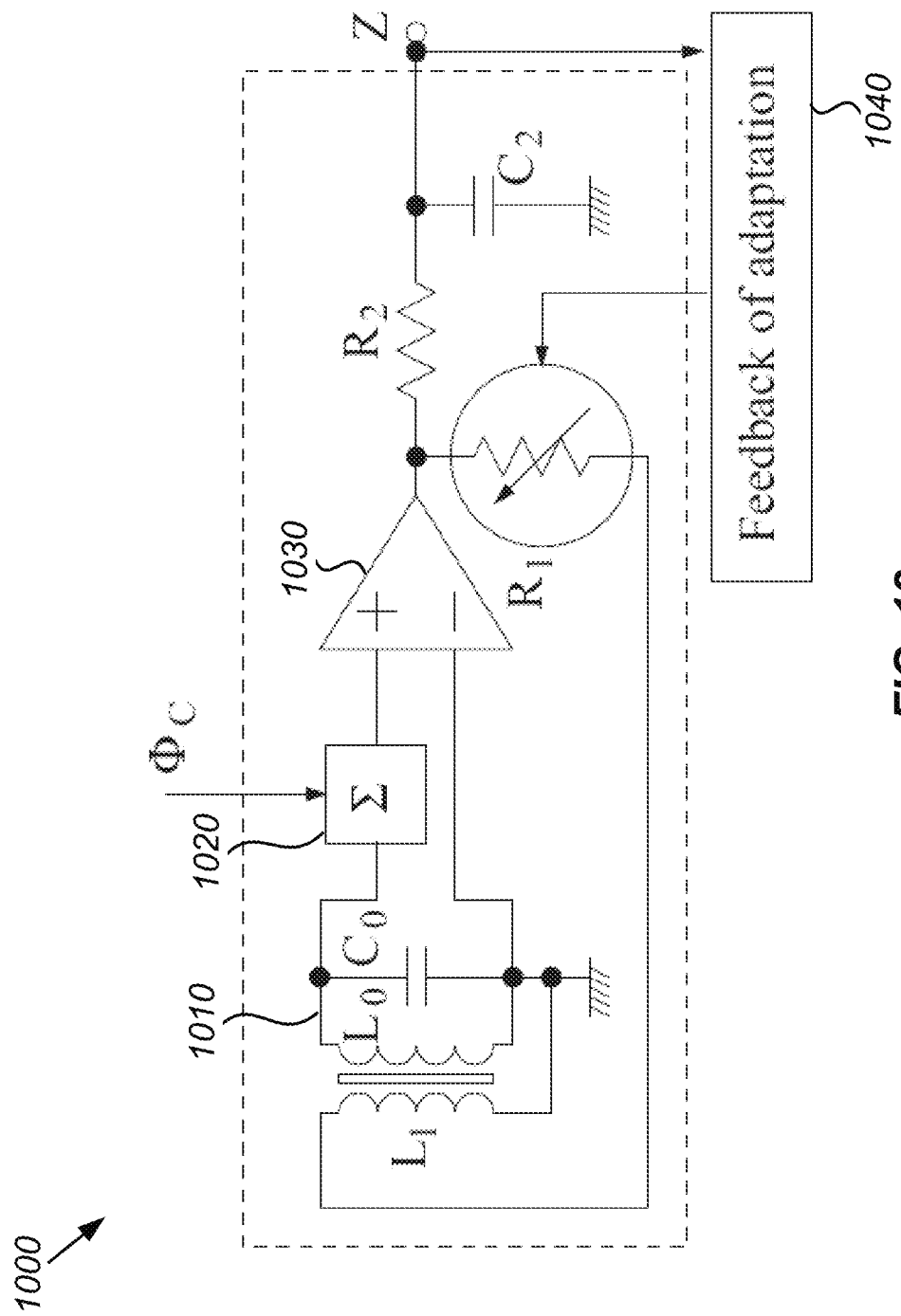
FIG. 12 shows a schematic diagram of a circuit of a sensor system in accordance with the disclosed embodiments.

FIG. 12 shows a schematic diagram of a circuit 1000 of a sensor system in accordance with the disclosed embodiments. Circuit 1000 includes an oscillator 1010 formed through the $L_0C_0$ resonance circuit, a summer 1020 connected to oscillator 1010, an operational amplifier 1030, a low-pass filter formed through the combination $R_2C_2$, and a variable resistor $R_1$. Summer 1020 is configured to receive signal $\Phi_C$ which is the sum of the output terms from all of the sensors as shown in Eq. (37) above. This signal is used as feedback applies to resistor $R_1$.

Feedback of the self-tuning adaptation for circuit 1000 is provided via box 1040, which is used to represent components such as non-linear squaring unit 950 and filter 960 shown in FIG. 11.

Circuit 1000 may represent a single unit of a sensor array with the output z and the additive input $\Phi_c$, with the sensor array shown in FIG. 14. In some embodiments, the sensor arrays are organized into square lattices, such as lattice 1100 shown in FIG. 13A and lattice 1110 shown in FIG. 13B. In some embodiments, an array may be a line array having a specified separation between the sensors. In the line array embodiments, the sensors would ideally not be placed too far apart to ensure that each sensor detects the same signal from a target. If the line array was in a sea water environment, for example, the sensors in the array would be coupled due to being in an electrically conductive medium. In some embodiments, an array may include several MEMS-scale (e.g. mm or cm) sensors on a circuit board or in a housing.

It is useful to provide some physical detail regarding the setup of the array in a system. In some embodiments, each sensor is positioned inside its individual Faraday cage made of nonmagnetic material (e.g., copper, aluminum). The cages are de facto low pass filters for electromagnetic fields, and can, significantly, reduce the interaction strength between sensor elements at their natural frequencies. At low frequency, however, the Faraday cages lose their effectiveness, so that the sensors are affected by the target magnetic field (this field is dc or at very low frequency) and the quasi-static parasitic magnetic fields from neighboring sensors, as well as the low frequency components of the noise.

One possible route to mitigate (or reduce) the losses stemming from the RE in a sensory array of the type disclosed herein is via a global feedback. Eq. (37) derived from the feedbacks depends on both the geometrical parameters of the array (the separation between sensors $l_{i,j}$) and the outputs $z_i$ of the individual units of the array. Note that Eq. (37) is an approximation of the ideal canceling term $\Phi_{c,i}=-\phi_i$ but, in contrast to the ideal cancellation term, it can be realized via the electrical circuit shown in FIGS. 12 and 14.

Since $\Phi_{c,i}$ differs from $-\phi_i$ (as already mentioned above), it is not able to completely cancel the parasitic coupling $\phi_i$ between the individual elements and sensors. Therefore, the theoretical limit of ideal performance cannot be reached in practice (unless the coupling is, identically, zero) and the RE still limits the array performance, albeit in a greatly reduced form.

Figure 15:
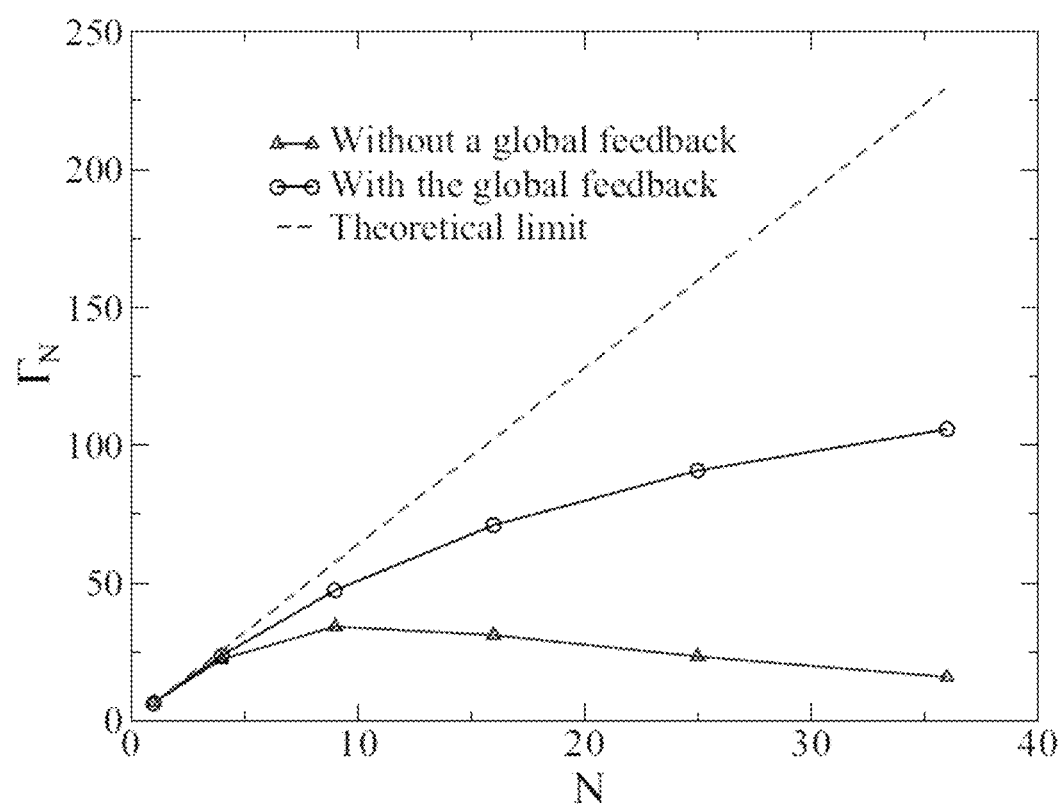
FIG. 15 shows a graph illustrating the mitigation of the Ringelmann effect in an array of sensors with global feedback in accordance with the disclosed embodiments.

FIG. 14 shows a diagram 1200 illustrating the connection of an array of sensors with global feedback in accordance with the disclosed embodiments. The array includes sensors 1210, 1220, 1230, and 1240. Each one of the sensors receives global feedback from a respective summer 1250, 1260, 1270, and 1280 and provides output to the summer that it does not receive global feedback from. For example, sensor 1210 receives global feedback from summer 1250 and provides output $z_1$ to summers 1260, 1270, and 1280. Each of the different summers may be configured to have different weights, as is required by Eq. (37). The results stemming from the feedbacks shown in FIG. 14 can be seen in graph 1300 shown in FIG. 15. As shown in graph 1300, the SNR is significantly improved but the theoretical limit is not reached due to the non-ideal structure of the canceling term $\Phi_{c,i}$.

Figure 16:
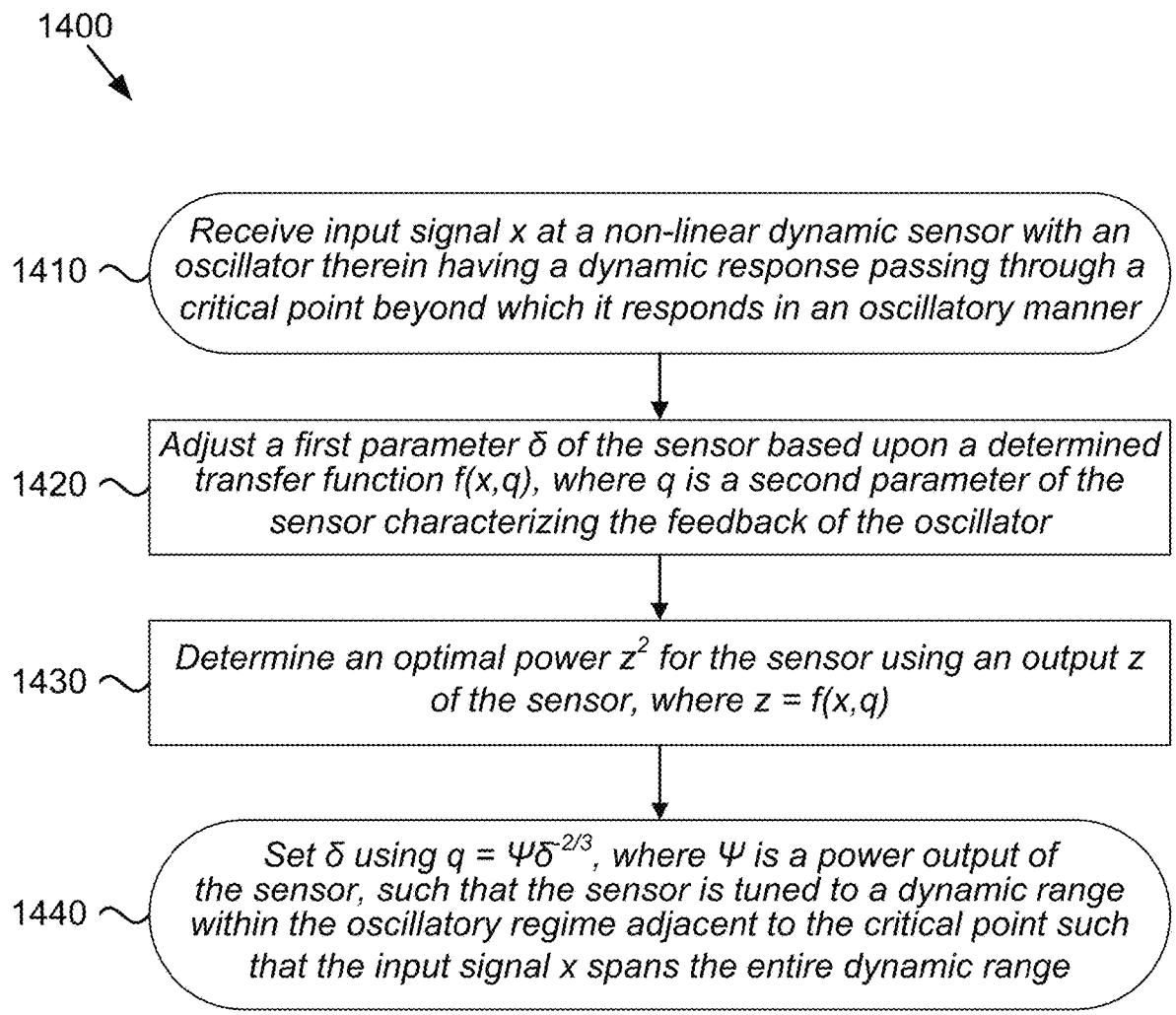
FIG. 16 shows a flowchart of an embodiment of a method in accordance with the embodiments disclosed herein.

FIG. 16 shows a flowchart of an embodiment of a method 1400 in accordance with the embodiments disclosed herein. Some or all of the steps of method 1400 may be performed by a system such as system 900 shown in FIG. 11 and/or system 1200 shown in FIG. 14, with functionality as described and shown in FIG. 12 built and incorporated into such systems. As such, reference may be made to any of the systems shown in FIG. 11, 12, or 14 when discussing the embodiment of the method 1400 shown in FIG. 16. Further, while FIG. 16 shows one embodiment of method 1400 including steps 1410-1440, other embodiments of method 1400 may contain fewer steps or more steps. Further, while in some embodiments the steps of method 1400 may be performed as shown in FIG. 14, in other embodiments the steps may be performed in a different order, or certain steps may occur simultaneously with one or more other steps.

Method 1400 begins with step 1410, which involves receiving, by a non-linear dynamic sensor 910, an input signal x 902, wherein an oscillator 1010 within the non-linear dynamic sensor 910 has a dynamic response that passes through a critical point beyond which the oscillator responds in an oscillatory regime. As an example, the sensor may have a bifurcated response similar to that as shown in FIG. 2, with the critical point being at the intersection of the V axis and the q axis. In some embodiments the non-linear dynamic sensor is a magnetic field sensor.

Method 1400 may then proceed to the step of adaptively self-tuning the non-linear dynamic sensor to a dynamic range within the oscillatory regime adjacent to the critical point such that the input signal x spans the entire dynamic range. This step is shown as steps 1420-1440 in FIG. 12. Accordingly, step 1420 involves adjusting a first parameter $\delta$ of the non-linear dynamic sensor 910 based upon a determined transfer function $f(x,q)$, where q is a second parameter of the non-linear dynamic sensor that characterizes feedback of the oscillator 1010. In some embodiments, $f(x,q)$ is determined in accordance with Eq. (1) above. FIG. 5 illustrates how changes in parameter $\delta$ change the dynamic range of the non-linear dynamic sensor. As an example, the dynamic range of x may be given by $[-\delta^{1/3}q^{5/6}, \delta^{1/3}q^{5/6}]$, but the dynamic range will depend upon the choice for 6.

Step 1430 involves determining an optimal power $z^2$ for the non-linear dynamic sensor 910. In some embodiments, step 1430 is performed using an output z of the non-linear dynamic sensor 910, where $z=f(x,q)$. In some embodiments, step 1430 is performed using a non-linear squaring unit 950 implemented within a processor operatively connected to the non-linear dynamic sensor 910, where the non-linear squaring unit 950 is configured to square the output z of the non-linear dynamic sensor 910. In some embodiments, analog devices can be used in place of the digital processor, for different realizations (for different applications) of the dynamic sensor system.

The system power output is $\psi \approx [f(s+\xi(t)]^2>$ where the angular brackets denote a time average (or an ensemble average under the appropriate conditions). (t) is the noise floor, which is usually Gaussian band-limited. The best power throughput is obtained when the input signal spans the entire dynamic range of the sensor. In this regime, the transfer characteristic $f(x,q)$ is quasilinear and the output power can be estimated as $\psi \approx q\delta^{2/3}$. This is the optimal (or maximum) output power attainable; the sensor is operating over its entire dynamic range. As such, step 1440 involves setting the first parameter $\delta$ via the relationship $q=\psi\delta^{-2/3}$, where is a power output of the non-linear dynamic sensor 910.

In some embodiments step 1440 is performed using a filter 940 (or $R_2C_2$ in FIG. 12) connected to oscillator 1010 via an amplifier 920/1030. As an example, the filter 940 may be a non-linear, low-pass filter. In some embodiments, step 1440 is performed using a variable resistor ($R_1$ in FIG. 12) connected to oscillator 1010. In some embodiments, step 1440 may be performed using a multiplier connected to oscillator 1010.

Some or all of the steps of method 1400 may be stored on a non-transitory computer readable storage medium, wherein the steps are represented by computer readable programming code. The steps of method 1400 may also be computer-implemented using a programmable device, such as a computer-based system. Method 1400 may comprise instructions that, when loaded into a computer-based system, cause the system to execute the steps of method 1400. Method 1400 may be implemented using various programming languages, such as "Java", "C", or "C++".

Various storage media, such as magnetic computer disks, optical disks, and electronic memories, as well as computer readable media and computer program products, can be prepared that can contain information that can direct a device, such as a micro-controller, to implement the above-described systems and/or methods. Once an appropriate device has access to the information and programs contained on the storage media, the storage media can provide the information and programs to the device, enabling the device to perform the above-described systems and/or methods.

For example, if a computer disk containing appropriate materials, such as a source file, an object file, or an executable file, were provided to a computer, the computer could receive the information, appropriately configure itself, and perform the functions of the various systems and methods outlined in the diagrams and flowcharts above to implement the various functions. That is, the computer could receive various portions of information from the disk relating to different elements of the above-described systems and/or methods, implement the individual systems and/or methods, and coordinate the functions of the individual systems and/or methods.

As a summary for some of the embodiments discussed herein, such embodiments relate to a non-linear dynamic sensor whose dynamics pass through a critical point beyond which there is a complete change in behavior (e.g. oscillatory solutions). Near the critical point (in the oscillating regime) the sensor is most sensitive to external signals. The sensor can be, adaptively, self-tuned to this optimal regime. In some embodiments, the sensor constantly senses the input signal and noise and computes, in real time (through an onboard processor), the optimal power in the output after adjusting the parameter δ. Then, the system (via a component such as a processor) adjusts other parameters (q in this case) so that the optimal power throughput is being realized, meaning the entirety of the dynamic range is utilized.

For embodiments involving a number of connected sensors that have the self-tuning mechanism on board each one, then inter-sensor coupling can degrade the response (given by a total power, or an output SNR, or an information function). However, implementing the feedback as described by Eq. 36 and shown in FIGS. 14 and 15) will restore a part of this lost performance.

The results discussed herein hold for any array of non-linear sensors (and the coupling can have any form) that can be, individually, tuned to a regime wherein their response to a target signal is optimized. Then, the Ringelmann effect appears to provide the underlying thread between the purely social interactions originally examined by Ringelmann and the (quite complex) sensor arrays that are increasingly possible with today's advanced technology.

The principles of coupling-induced performance loss should be generic to many systems across the physical, biological, engineering, and social sciences. Adaptive (self-tuning) schemes for operating isolated subunits (e.g., people, animals, optical sensors and systems, parallel inverters and converters in power electronics, and antenna arrays) close to their optimal operating points can be devised but become less effective when coupled into a complex interacting network. In addition to the local optimization (adaptation), some form of global optimization, e.g., via feedback, can help to mitigate Ringelmann-type effects. These principles are expected to be generic across a wide class of non-linear dynamic systems.

While the coupling-induced loss and the RE can occur in many coupled non-linear dynamic systems, it is the self-tuning to an optimal point (effectively poised on the threshold of the Andronov-Hopf bifurcation in our case) that is a central feature of signal processing in the cochlea. Thus the embodiments of the disclosed sensor array are not biomimetic unless the self-tuning mechanism is incorporated into in each sensor prior to setting up the array.

Many modifications and variations of the embodiments disclosed herein are possible in light of the above description. Within the scope of the appended claims, the disclosed embodiments may be practiced otherwise than as specifically described. Further, the scope of the claims is not limited to the implementations and embodiments disclosed herein, but extends to other implementations and embodiments as may be contemplated by those having ordinary skill in the art.

We claim:

1. A method comprising the steps of:
    receiving, by a non-linear dynamic sensor, an input signal x, wherein an oscillator within the non-linear dynamic sensor has a dynamic response that passes through a critical point beyond which the oscillator responds in an oscillatory regime; and
    adaptively self-tuning the non-linear dynamic sensor, including adjusting an extent up to a specified deviation allowed from linearity of a dynamic range within the oscillatory regime adjacent to the critical point until the input signal x spans an entirety of the extent of the dynamic range.

2. The method of claim 1, wherein the step of adaptively self-tuning the non-linear dynamic sensor comprises the steps of:
    accepting a parameter δ specifying the allowed deviation from the linearity of a determined transfer function $f(x,q)$ of the non-linear dynamic sensor, where parameter q of the non-linear dynamic sensor characterizes feedback of the oscillator;
    determining an output power ψ from the non-linear dynamic sensor receiving the input signal x; and
    adjusting the feedback parameter q according to the relationship $q=\psi\delta^{-2/3}$, wherein adjusting the feedback parameter q accordingly adjusts the extent of the dynamic range and an amplification coefficient of the non-linear dynamic sensor.

3. The method of claim 2, wherein the step of determining the output power ψ includes determining an optimal power $z^2$ for the non-linear dynamic sensor from an output z of the non-linear dynamic sensor, wherein $z=f(x,q)$.

4. The method of claim 3, wherein the step of determining an optimal power $z^2$ for the non-linear dynamic sensor is performed using a non-linear squaring unit implemented within a processor operatively connected to the non-linear dynamic sensor, wherein the non-linear squaring unit is configured to square the output z of the non-linear dynamic sensor.

5. The method of claim 2, wherein the step of adjusting the feedback parameter q according to the relationship $q=\psi\delta^{-2/3}$ is performed using a filter connected to the oscillator via an amplifier.

6. The method of claim 5, wherein the filter is a non-linear, low-pass filter.

7. The method of claim 2, wherein the step of adjusting the feedback parameter q according to the relationship $q=\psi\delta^{-2/3}$ is performed using a variable resistor connected to the oscillator.

8. The method of claim 2, wherein $$f(x,q) = \text{sgn}(x)\sqrt{q}\left[1 - \exp\left(-\frac{|x|}{q}\right)\right]\exp\left(-\frac{x^2}{q^2}\right).$$

9. The method of claim 1, wherein the non-linear dynamic sensor is a magnetic field sensor.

10. A system comprising:
    a non-linear dynamic sensor having an oscillator therein, the oscillator having a dynamic response that passes through a critical point beyond which the oscillator responds in an oscillatory regime; and
    a processor operatively connected to the non-linear dynamic sensor, the processor configured to, based upon an input signal x received by the non-linear dynamic sensor, adaptively self-tune the non-linear dynamic sensor, including adjusting an extent up to a specified deviation allowed from linearity of a dynamic range within the oscillatory regime adjacent to the critical point until the input signal x spans an entirety of the extent of the dynamic range.

11. The system of claim 10, wherein the processor is configured to adaptively self-tune the non-linear dynamic sensor by accepting a parameter δ specifying the allowed deviation from the linearity of a determined transfer function $f(x,q)$ of the non-linear dynamic sensor, where parameter q of the non-linear dynamic sensor characterizes feedback of the oscillator, determining an output power ψ from the non-linear dynamic sensor receiving the input signal x, and adjusting the feedback parameter q according to the relationship $q=\psi\delta^{-2/3}$, wherein adjusting the feedback parameter q accordingly adjusts the extent of the dynamic range and an amplification coefficient of the non-linear dynamic sensor.

12. The system of claim 11, wherein the processor is configured to determine an optimal power $z^2$ for the non-linear dynamic sensor using an output z of the non-linear dynamic sensor, wherein $z=f(x,q)$.

13. The system of claim 12, wherein the processor further comprises a non-linear squaring unit implemented therein, wherein the step of determining an optimal power $z^2$ for the non-linear dynamic sensor is performed using the non-linear squaring unit, wherein the non-linear squaring unit is configured to square the output z of the non-linear dynamic sensor.

14. The system of claim 11, wherein the processor further includes a filter connected to the oscillator via an amplifier, wherein the processor is configured to perform the step of adjusting the feedback parameter q according to the relationship $q=\psi\delta^{-2/3}$ using the filter.

15. The system of claim 14, wherein the filter is a non-linear, low-pass filter.

16. The system of claim 10, wherein the non-linear dynamic sensor is a magnetic field sensor.

17. A system comprising:
a plurality of connected non-linear dynamic sensors each having an oscillator therein with a dynamic response that passes through a critical point beyond which the oscillator responds in an oscillatory regime; and
a separate processor operatively connected to each of the non-linear dynamic sensors, each separate processor configured to, based upon an input signal x received by its respectively connected non-linear dynamic sensor, adaptively self-tune the respective non-linear dynamic sensor to a dynamic range within the oscillatory regime adjacent to the critical point such that the input signal x spans the entire dynamic range,
wherein each processor has a summer implemented therein, wherein each summer is configured to receive inputs from more than one of the plurality of non-linear dynamic sensors and provide a global feedback to another of the plurality of non-linear dynamic sensors based upon the received inputs.

18. The system of claim 17, wherein the processor is configured to adaptively self-tune the non-linear dynamic sensor by accepting a parameter δ specifying an allowed deviation from linearity of a determined transfer function $f(x,q)$ of the non-linear dynamic sensor, where parameter q of the non-linear dynamic sensor characterizes feedback of the oscillator, determining an output power ψ from the non-linear dynamic sensor receiving the input signal x, and adjusting the feedback parameter q according to the relationship $q=\psi\delta^{-2/3}$, wherein adjusting the feedback parameter q accordingly adjusts an extent of the dynamic range and an amplification coefficient of the non-linear dynamic sensor.

19. The system of claim 18, wherein each non-linear dynamic sensor further comprises a filter connected to the oscillator via an amplifier, wherein each processor is configured to adjust the feedback parameter q according to the relationship $q=\psi\delta^{-2/3}$ using the filter.

20. The system of claim 17, wherein each of the plurality of non-linear dynamic sensors comprise a magnetic field sensor.

* * * * *